(12) United States Patent
Ong et al.

(10) Patent No.: US 11,158,577 B2
(45) Date of Patent: Oct. 26, 2021

(54) METHODS FOR FABRICATING MICROELECTRONIC DEVICES WITH CONTACTS TO CONDUCTIVE STAIRCASE STEPS, AND RELATED DEVICES AND SYSTEMS

(71) Applicant: Micron Technology, Inc., Boise, ID (US)

(72) Inventors: Biow Hiem Ong, Singapore (SG); David A. Daycock, Singapore (SG); Chieh Hsien Quek, Singapore (SG); Chii Wean Calvin Chen, Singapore (SG); Christian George Emor, Singapore (SG); Wing Yu Lo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 16/778,346

(22) Filed: Jan. 31, 2020

(65) Prior Publication Data
US 2021/0242131 A1    Aug. 5, 2021

(51) Int. Cl.
| | |
|---|---|
| *H01L 23/535* | (2006.01) |
| *H01L 21/768* | (2006.01) |
| *H01L 23/522* | (2006.01) |
| *H01L 23/528* | (2006.01) |
| *H01L 23/532* | (2006.01) |

(Continued)

(52) U.S. Cl.
CPC ...... *H01L 23/535* (2013.01); *H01L 21/76805* (2013.01); *H01L 21/76816* (2013.01); *H01L 21/76843* (2013.01); *H01L 21/76877* (2013.01); *H01L 21/76895* (2013.01); *H01L 23/5226* (2013.01); *H01L 23/5283* (2013.01); *H01L 23/53266* (2013.01); *H01L 27/11526* (2013.01); *H01L 27/11556* (2013.01); *H01L 27/11582* (2013.01)

(58) Field of Classification Search
CPC .................. H01L 27/11526; H01L 23/535
See application file for complete search history.

(56) References Cited

U.S. PATENT DOCUMENTS

| | | |
|---|---|---|
| 5,206,187 A | 4/1993 | Doan et al. |
| 5,231,054 A | 7/1993 | Kosugi |

(Continued)

*Primary Examiner* — Farun Lu
(74) *Attorney, Agent, or Firm* — TraskBritt

(57) ABSTRACT

Methods for forming microelectronic devices include forming a staircase structure in a stack structure having a vertically alternating sequence of insulative and conductive materials arranged in tiers. Steps are at lateral ends of the tiers. Contact openings of different aspect ratios are formed in fill material adjacent the staircase structure, with some openings terminating in the fill material and others exposing portions of the conductive material of upper tiers of the stack structure. Additional conductive material is selectively formed on the exposed portions of the conductive material. The contact openings initially terminating in the fill material are extended to expose portions of the conductive material of lower elevations. Contacts are formed, with some extending to the additional conductive material and others extending to conductive material of the tiers of the lower elevations. Microelectronic devices and systems incorporating such staircase structures and contacts are also disclosed.

18 Claims, 17 Drawing Sheets

(51) Int. Cl.
*H01L 27/11526* (2017.01)
*H01L 27/11582* (2017.01)
*H01L 27/11556* (2017.01)

(56) References Cited

U.S. PATENT DOCUMENTS

| | | | |
|---|---|---|---|
| 5,298,463 | A | 3/1994 | Sandhu et al. |
| 5,633,201 | A | 5/1997 | Choi |
| 6,461,887 | B1 | 10/2002 | Pradeep et al. |
| 9,870,941 | B2 | 1/2018 | Ha et al. |
| 10,002,787 | B2 | 6/2018 | Yu et al. |
| 2010/0255669 | A1 | 10/2010 | Blomiley et al. |
| 2020/0091081 | A1* | 3/2020 | Hatazaki ............ H01L 27/11578 |

\* cited by examiner

METHODS FOR FABRICATING MICROELECTRONIC DEVICES WITH CONTACTS TO CONDUCTIVE STAIRCASE STEPS, AND RELATED DEVICES AND SYSTEMS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having staircases and conductive contacts to various step elevations of the staircases, to related devices, and to systems incorporating such devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line.

A 3D NAND memory device also includes electrical connections between, e.g., access lines (e.g., word lines) and other conductive structures of the device so that the memory cells of the vertical strings can be selected for writing, reading, and erasing operations. String drivers drive the access line (e.g., word line) voltages to write to or read from the memory cells of the vertical string.

One method of forming such electrical connections includes forming a so-called "staircase" structure having "steps" (or otherwise known as "stairs") at edges (e.g., lateral ends) of the tiers of the stack structure. The steps define contact regions of conductive structures of the device, such as access lines (e.g., word lines), which may be formed by the conductive materials of the tiered stack. Conductive contacts are formed to be in physical and electrical contact with the steps to provide electrical access to a conductive structure (e.g., word line) associated with each respective step. With the steps being at various different elevations in the staircases, forming the conductive contacts to the various different elevations, present challenges, particularly as this tends to involve forming a number of openings with aspect ratios (e.g., height-to-width ratios) spanning a broad range of ratios.

DETAILED DESCRIPTION

Figure 1:
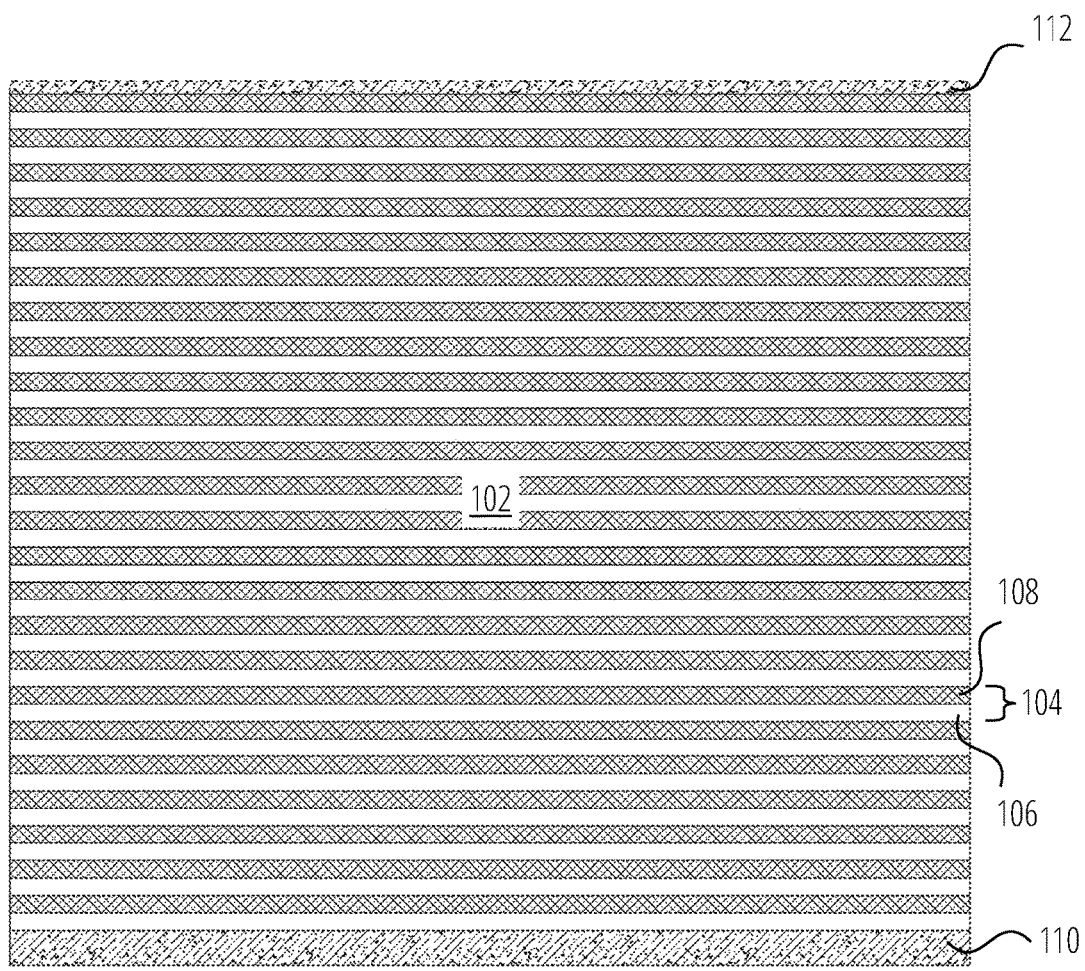
FIG. 1 to FIG. 7 are cross-sectional, elevational, schematic illustrations during various stages of processing to fabricate the microelectronic device structure illustrated in FIG. 7, according to embodiments of the disclosure.

Methods for forming structures (e.g., microelectronic device structures), according to embodiments of the disclosure, include forming a staircase structure in a stack of vertically alternating conductive structures and insulative structures; forming contact openings by etching down to an elevation of the stack that is part-way down the staircase; growing conductive extensions at the base of the contact openings only where the contact openings expose conductive material of the conductive structures of the stack; and then completing the formation of contact openings by etching down to lower elevations of the stack. During the latter etching process to complete the formation of the contact openings, the previously-grown conductive extensions protect the conductive structures from also being etched in a manner that would form unintentional openings through the conductive structures (e.g., word lines). The methods ensure integrity of the conductive structures during material-removal acts that form conductive openings of multiple aspect ratios (e.g., height-to-width ratios), without requiring complex, costly, and/or time-consuming multiple etch-and-mask cycles.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is (are) not necessarily in contact with an atmosphere or non-solid environment. Structure(s) or material(s) "exposed" within an opening may be adjacent or in contact with other structure(s) or material(s) that is (are) disposed within the opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis.

As used herein, the terms "vertical" or "longitudinal" mean and include a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis and may be perpendicular to an indicated "X" axis.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

FIG. 1 to FIG. 7 illustrate various stages in a method of forming a microelectronic device structure (e.g., a memory device structure, such as a 3D NAND memory device structure), according to embodiments of the disclosure, for an apparatus (e.g., a memory device, such as a 3D NAND memory device).

With reference to FIG. 1, a stack structure 102 of tiers 104 of vertically alternating insulative structures 106 and other structures 108 are formed on or over base material(s) 110 by forming (e.g., depositing) the materials thereof in sequence, one after the other, from lower elevations to upper elevations. Insulative material(s) of the insulative structures 106 include at least one electrically insulative material (e.g., a dielectric oxide material, such as silicon dioxide). In embodiments in which the microelectronic device structure to be formed includes "replacement gates," the material(s) of the other structures 108 includes at least one sacrificial material, such as a dielectric material (e.g., a dielectric nitride material, such as silicon nitride) that may be selectively removed relative to the insulative materials of the insulative structures 106 in subsequent processing acts. In other embodiments, the material(s) of the other structures 108 include an electrically conductive material (e.g., conductively doped polysilicon) that will not be replaced during subsequent processing acts. Methods of forming stack structures of insulative structures 106 vertically alternating (e.g., interleaved) with other structures 108 are known in the art and so are not describe in detail herein.

In some embodiments, a sacrificial material 112 (e.g., a polysilicon material) may, optionally, be formed on or over the stack structure 102. In other embodiments, the sacrificial material 112 may be omitted, and the uppermost material of the stack structure 102 may be exposed going into the next fabrication stage.

Figure 2:
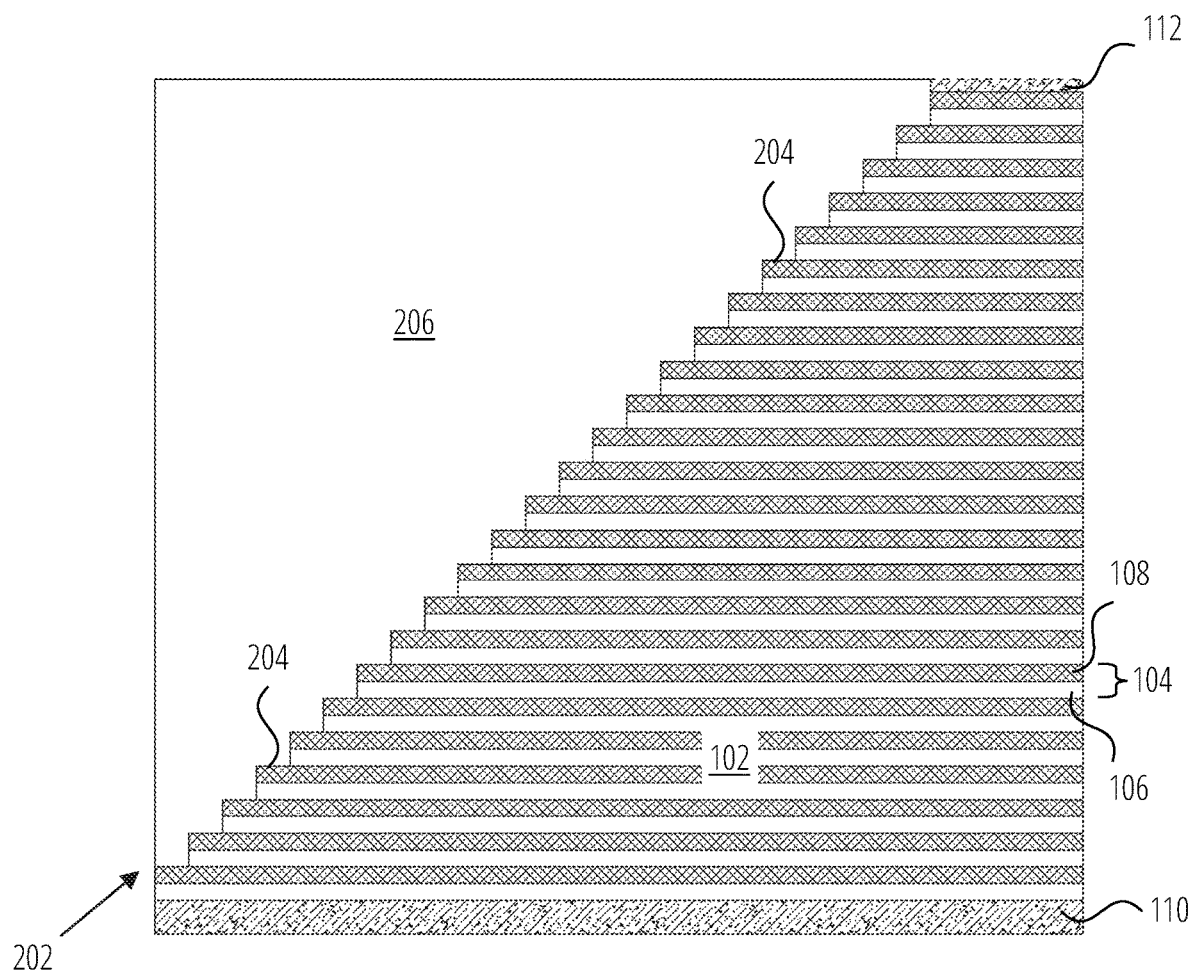

With reference to FIG. 2, a staircase structure 202 may be formed in the stack structure 102, e.g., by etching each of the tiers 104 to define steps 204 at a lateral end of each of the tiers 104. Fill material 206 (e.g., one or more insulative materials) is then formed to fill the space adjacent the staircase structure 202. While FIG. 2 illustrates only a single staircase structure 202, additional staircase structures 202 may be formed before, concurrently with, or subsequent to forming the staircase structure 202. For example, a second staircase structure may be formed opposing the staircase structure 202.

Figure 3:
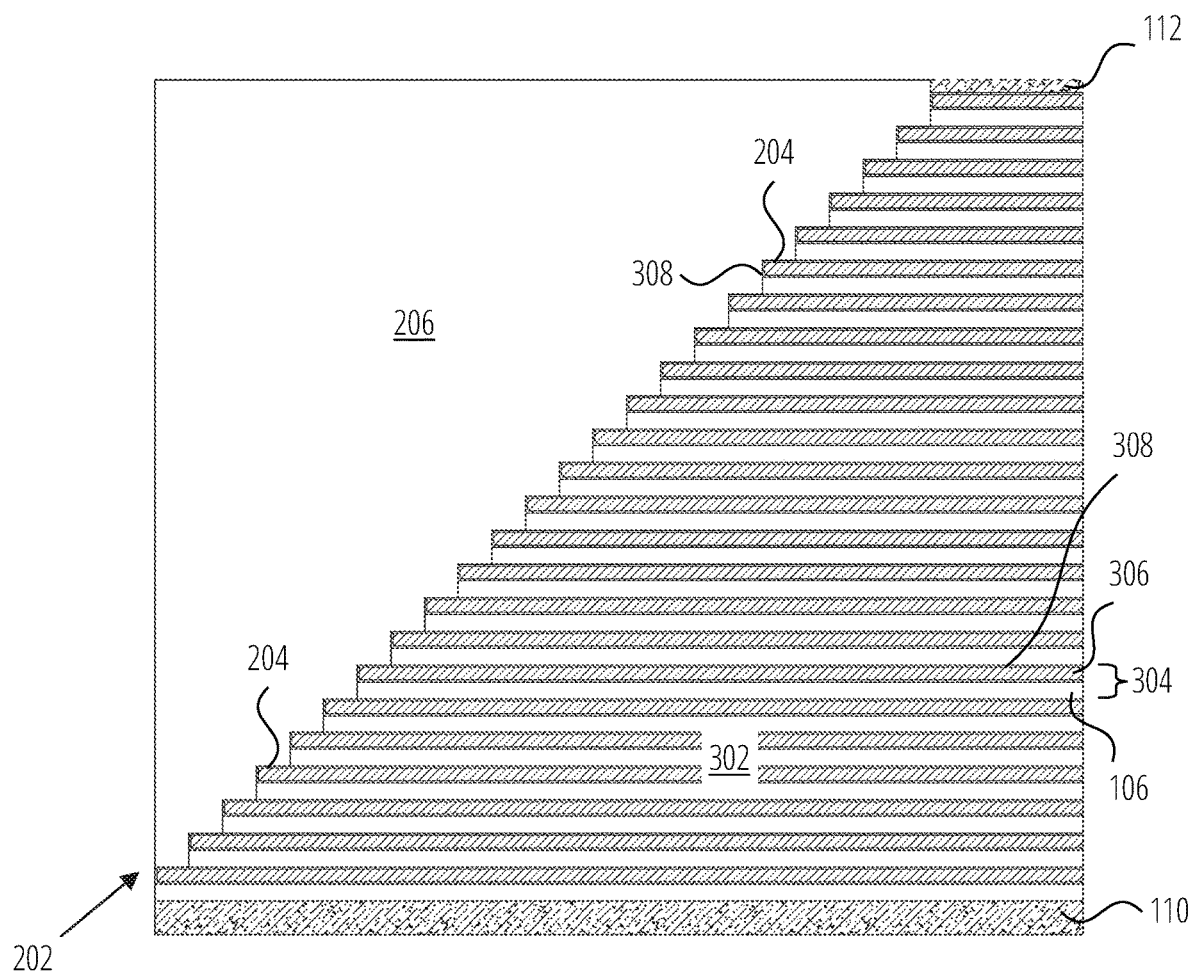
Figure 3:
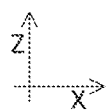

In embodiments in which the other structures 108 of the stack structure 102 include sacrificial material, the other structures 108 may then be removed and replaced with conductive materials, as illustrated in FIG. 3, e.g., by so-called "replacement gate" processes known in the art, converting the stack structure 102 of FIG. 2 into a stack structure 302 with tiers 304 of the insulative structures 106 vertically alternating with conductive structures 306. In some embodiments, a liner 308 may be included along the outside of the conductive structures 306. For example, after removing the sacrificial material of the other structures 108 of FIG. 2, the liner 308 may be formed (e.g., deposited) on surfaces exposed by the removal of the sacrificial material, such as on surfaces of the insulative structures 106 and the fill material 206. The liner 308 may include, e.g., a conductive nitride material (e.g., tungsten nitride). After forming the liner 308, conductive material (e.g., a metal, such as tungsten) may be formed (e.g., deposited) within the liner 308, forming the conductive structure 306 of each of the tiers 304 of the stack structure 302.

Accordingly, at completion of the processing stage illustrated in FIG. 3, the stack structure 302 includes vertically alternating tiers of insulative material (e.g., in the insulative structures 106) and conductive material(s) in the conductive structures 306. In embodiments in which the conductive structures 306 are configured as "replacement gates," the conductive material(s) thereof include the liner 308 (e.g., a nitride material) and the conductive material (e.g, tungsten) of the conductive structures 306. In other embodiments in which the conductive structures 306 are not configured as replacement gates, the conductive structures 306 remain as the other structures 108 of FIG. 2 and may include, e.g., a non-sacrificial conductive material, such as conductively doped polysilicon.

Figure 4:
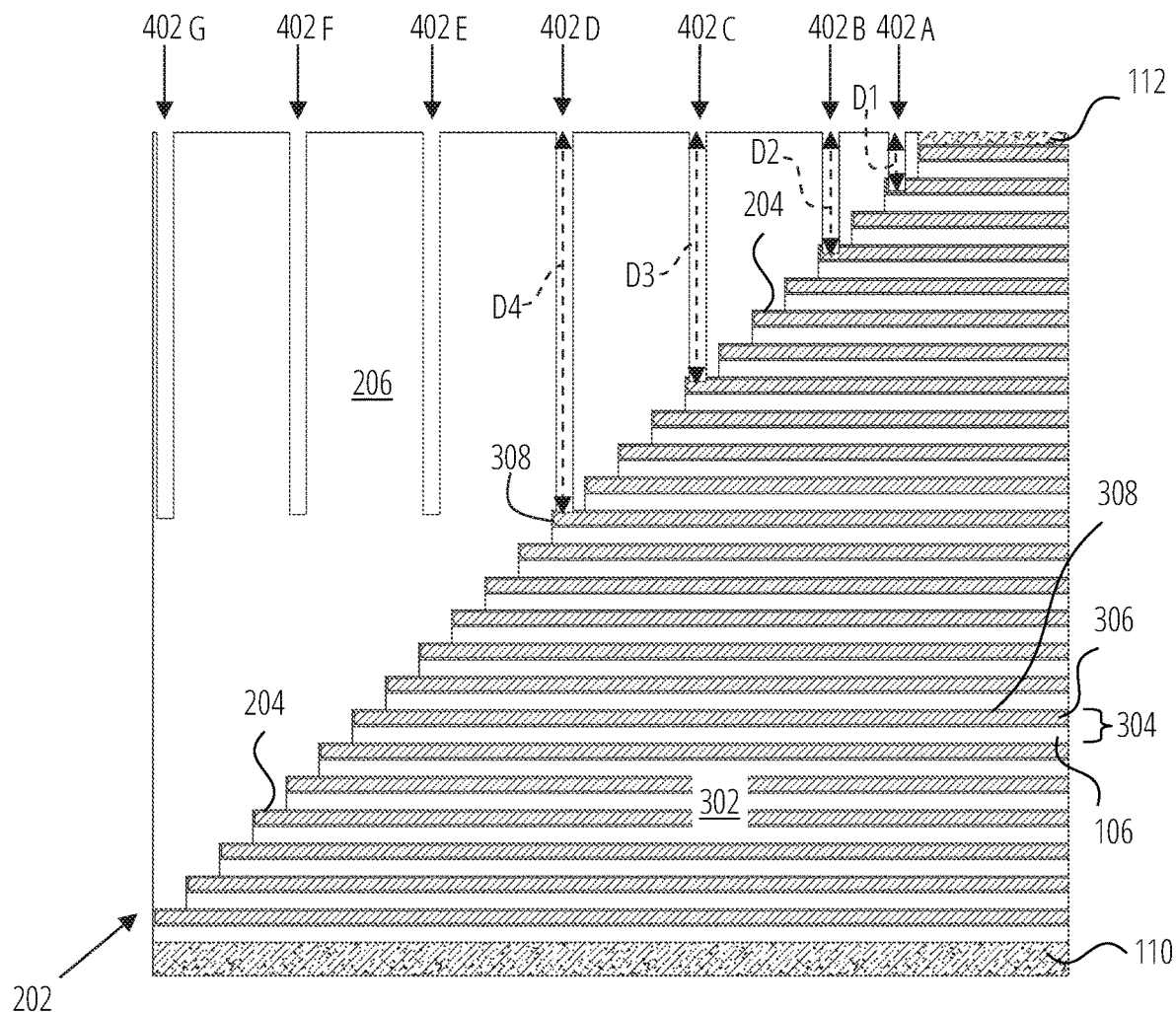

Openings for contact structures, which are to be in electrical connection with select steps 204 of the microelectronic device structure being fabricated, may then be formed (e.g., in a single material-removal act). With reference to FIG. 4, select portions of the fill material 206 are removed (e.g., etched) to form contact openings 402A-G. A photomask may be used in the material-removal process.

At least some of the contact openings 402A-G have different depths D1, D2, D3, D4, and/or different aspect ratios (e.g., height-to-width ratios, e.g., depth-to-width ratios) than others of the contact openings 402A-G. Some or all of the aspect ratios may be "high aspect ratios," e.g., at least about 3:1 (e.g., at least about 10:1) for the shallowest of the contact openings (e.g., contact opening 402A). Though the contact openings 402A-G of the figures are illustrated with perfectly vertical sidewalls, in some embodiments the sidewalls may be angled or otherwise less than or greater than vertical. In such embodiments, the aspect ratio is defined based on the width of the contact opening 402 at the top surface of the stack structure 302 (e.g., at the upper surface of the uppermost tier 304) and the height (or depth) of the contact opening 402 from that top surface to the bottom of the contact opening 402. The contact openings 402A-G may or may not have the same widths (or width profiles, for non-vertical sidewalls). In embodiments in which the contact openings 402A-G each have the same width (or width profiles), the different aspect ratios of the contact openings 402A-G are characterizeable, e.g., D1:width, D2:width, D3:width, D4:width.

The contact openings 402A-G are formed to extend, at most, only part-way down the overall height (e.g., vertical dimension in the "Z"-direction) of the staircase structure 202. For example, in some embodiments, the deepest contact openings 402D-G may extend only up to about 50% of the height of the staircase structure 202 (e.g., up to about 50% of the height of the stack structure 302). Therefore, in the staircase structure 202, which is illustrated to include twenty-four tiers 304—though, in other embodiments, the staircase structures 202 may include more or fewer tiers 304—the contact openings 402A-G may extend only to, at most, about the twelfth tier 304 (e.g., to about the conductive structure 306 of the twelfth tier 304) from the top of the staircase structure 202 (and the stack structure 302).

The depth of the contact openings 402A-G, or at least the deepest of the contact openings 402A-G (e.g., contact openings 402D-G), may be controlled by, e.g., controlling the duration of the material-removal (e.g., etching) act. In some embodiments, conventional etchants may be used, but for a shorter exposure duration than used in conventional fabrication processes for forming contact openings extending to an entire height of a staircase structure.

One contact opening 402A-G may be formed for each conductive contact to be included in the microelectronic device being fabricated. Where targeted steps 204 are at elevations below the maximum depth of the contact openings (e.g., depth D4), the corresponding contact openings (e.g., contact openings 402E-G) terminate within, and are defined wholly by, the fill material 206. Where targeted steps 204 are at elevations equal or above the maximum depth of the contact openings (e.g., depth D4), the corresponding contact openings (e.g., contact openings 402A-D) extend to and expose at least a portion of the conductive structure 306 with the targeted step 204.

Given the nature of material-removal acts, such as etching, the shallowest of the contact openings (e.g., contact opening 402A at depth D1) will be first to expose a portion of conductive structure 306, then the second shallowest (e.g., contact opening 402B at D2), and so on until the material-removal act is ceased (e.g., upon reaching depth D4). Therefore, as the material-removal (e.g., etching) continues, the portions of the conductive structures 306 exposed at the higher elevations (e.g., upper tiers 304) of the staircase structure 202 are the portions of the conductive structure 306 that will be longest subjected to, e.g., etchants.

Though etchants of the material-removal act may be formulated to selectively remove the fill material 206 relative to material of the conductive structures 306, prolonged exposure to the etchants may, in some embodiments, cause some material removal from the exposed portions of the conductive structures 306, as well. Therefore, at completion of forming the contact openings 402A-G, the shallowest contact opening 402A may extend some distance into its corresponding conductive structure 306, the second-shallowest contact opening 402B may extend a lesser distance into its corresponding conductive structure 306, etc., while the deeper conductive-material-exposing contact openings 402 (e.g., contact opening 402D) may not extend into their corresponding conductive structures 306 at all. In other embodiments, such as if the conductive material of the conductive structures 306 is strongly resistant to the etchants used or if the duration of the material-removal act is minimized to avoid removal of any conductive material, none of the contact openings exposing conductive structures 306 (e.g., none of contact openings 402A-D) may extend into the conductive structures 306.

Notably, were the material-removal acts to be continued immediately following formation of the contact openings 402A-G, the continued material-removal act (e.g., etching) may cause one or more of the exposed portions of the conductive structures 306 in the uppermost tiers 304 to be entirely removed, leaving a hole in the conductive structure 306. Subsequent formation of a contact within the contact opening would inevitably result in the contact "landing" below its target step 204, which may inhibit effective electrical contact between desired conductive structures of the microelectronic device.

To ensure the integrity of the conductive structures 306 are maintained and protected during subsequent material-removal acts (e.g., further etching), embodiments of the disclosure include selectively forming (e.g., growing) additional conductive material on the portions of the conductive structures 306 exposed within any of the contact openings 402 formed in the initial material-removal act.

Figure 5:
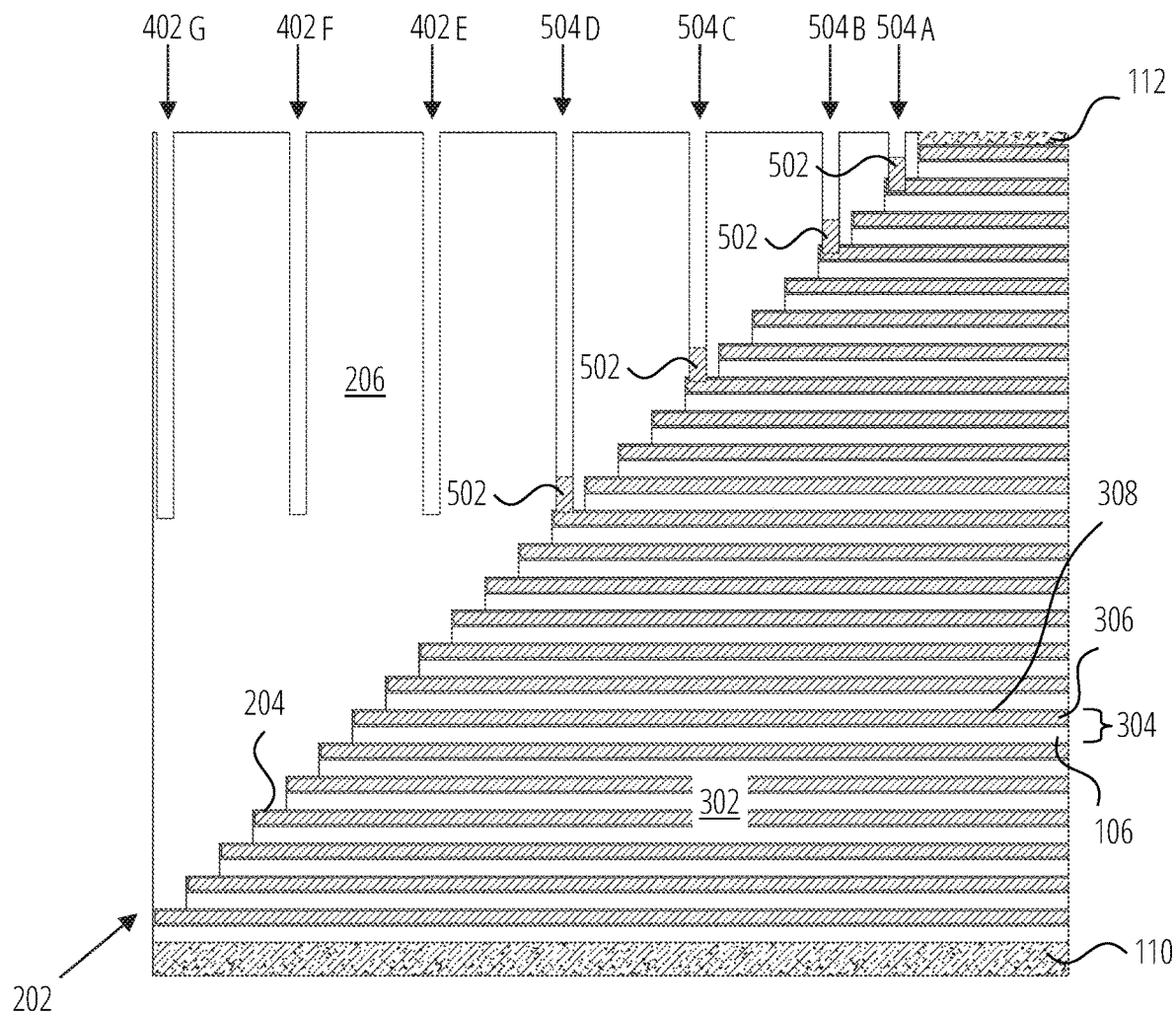
Figure 6:
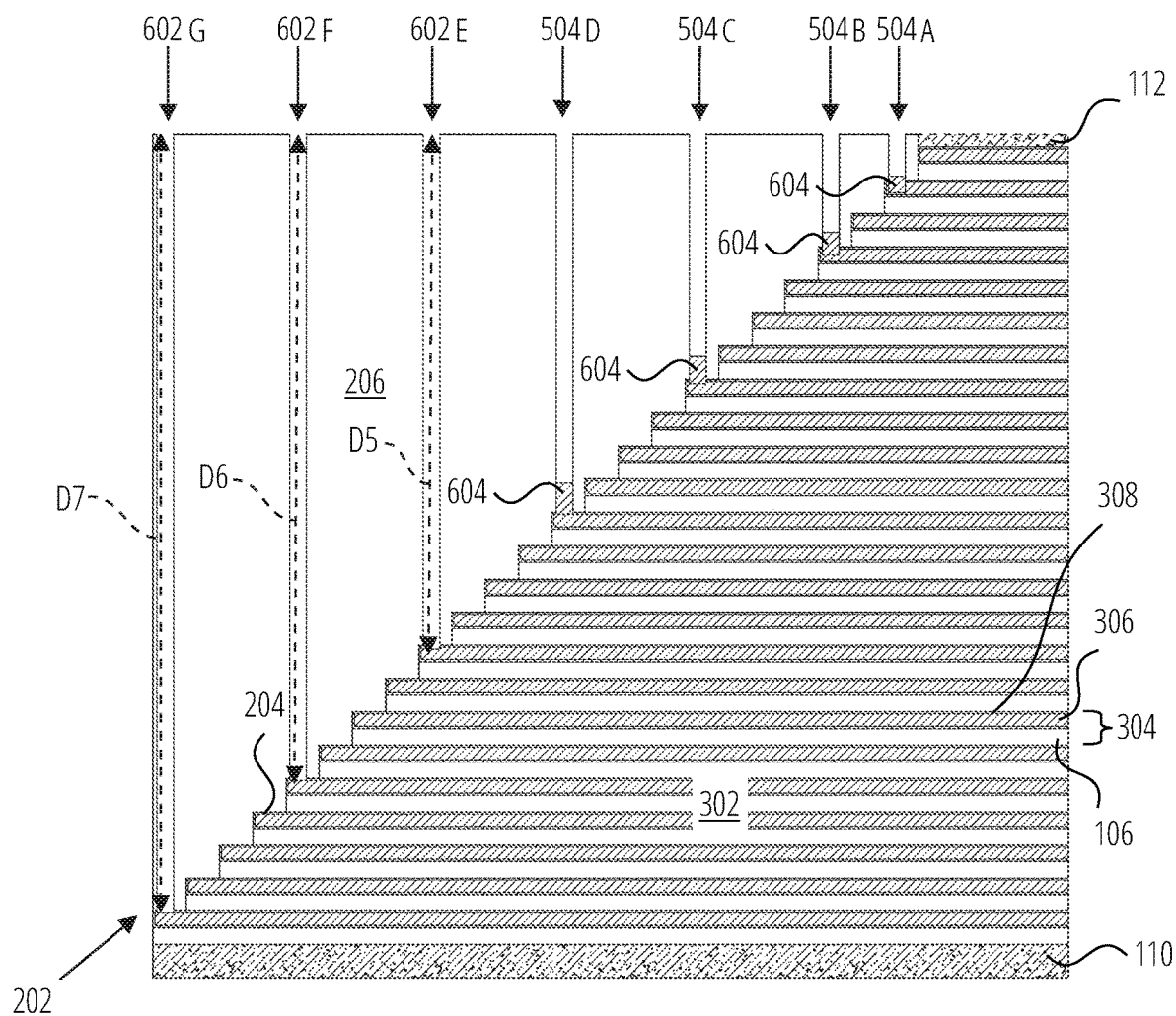

With reference to FIG. 5, a conductive material (e.g., one or more of the conductive materials described above with respect to that of the conductive structures 306, such as tungsten) is selectively formed (e.g., grown) on only the conductive structures 306 exposed within the contact openings 402 of FIG. 4 (e.g., at the bottom of contact openings 402A-D of FIG. 4). For example, after forming the contact openings 402A-D, native oxides may be removed from the exposed conductive structures 306 (e.g., at the bottom of contact openings 402A-D), followed by a surface treatment of the exposed portions of the conductive structures 306 to prepare the exposed surfaces for formation (e.g., growth, deposition) of the conductive material. Thereafter, the conductive material may be formed (e.g., grown, deposited) with selectivity on only the exposed portions of the conductive structures 306 and not on the fill material 206. Thus formed are conductive growths 502 in direct physical contact with the conductive structures 306 in partially-filled contact openings 504A-D of FIG. 5.

The conductive growths 502 may be formed (e.g., in a single material-formation act) to a desired thickness (e.g., vertical height), which may be one or more times greater than an initial thickness of each of the conductive structures 306. Each of the conductive growths 502 may be formed to the same thickness of grown (e.g., deposited) conductive material. In embodiments in which formation of the contact openings 402A-G resulted in some loss of material from exposed portions of the conductive structures 306, the conductive growths 502 in the partially-filled contact openings 504A-D may protrude different heights above an upper surface of its respective conductive structure 306. For example, because the shallowest contact opening 402A of FIG. 4 extended further into its corresponding conductive structure 306 than, e.g., contact opening 402D of FIG. 4, the conductive growth 502 in the resulting shallowest partially-filled contact opening 504A extends upward, beyond an upper surface of its corresponding conductive structure 306, less than the conductive growth 502 in partially-filled contact opening 504D extends beyond an upper surface of its corresponding conductive structure 306.

With the conductive growths 502 in place, one or more additional material-removal acts (e.g., etchings) is performed to complete the formation of the contact openings to remaining targeted steps 204 in lower elevations of the staircase structure 202. For example, the contact openings 402E-G, which terminated in the fill material 206, are extended to form extended contact openings 602E-G of FIG. 6. The extended contact openings 602E-G each expose a portion of a corresponding one of the conductive structures 306, though at lower elevations than those of the conductive structures 306 partly exposed in the previous material-removal act. Some or all of the extended contact openings 602 may also have different depths (e.g., D5, D6, D7), different aspect ratios, and or different widths than one another.

During the additional material-removal act(s) to form the extended contact openings 602E-G, the partially-filled contact openings 504A-D may remain uncovered such that the conductive growths 502 (FIG. 5) are also exposed to whatever material-removing formulation(s) (e.g., etchant(s)) are used to form the extended contact openings 602E-G. In some embodiments, the exposure of the conductive growths 502 (FIG. 5) to the material-removal formulation may cause some of the conductive growth 502 material to be removed. However, the conductive growths 502 (FIG. 5) will have been formed to a thickness tailored to ensure that at least some of the conductive growths 502 (FIG. 5) remain, following completion of the formation of the extended contact openings 602E-G, to form conductive extensions 604 remaining in the bottom of the partially-filled contact openings 504A-D.

Figure 7:
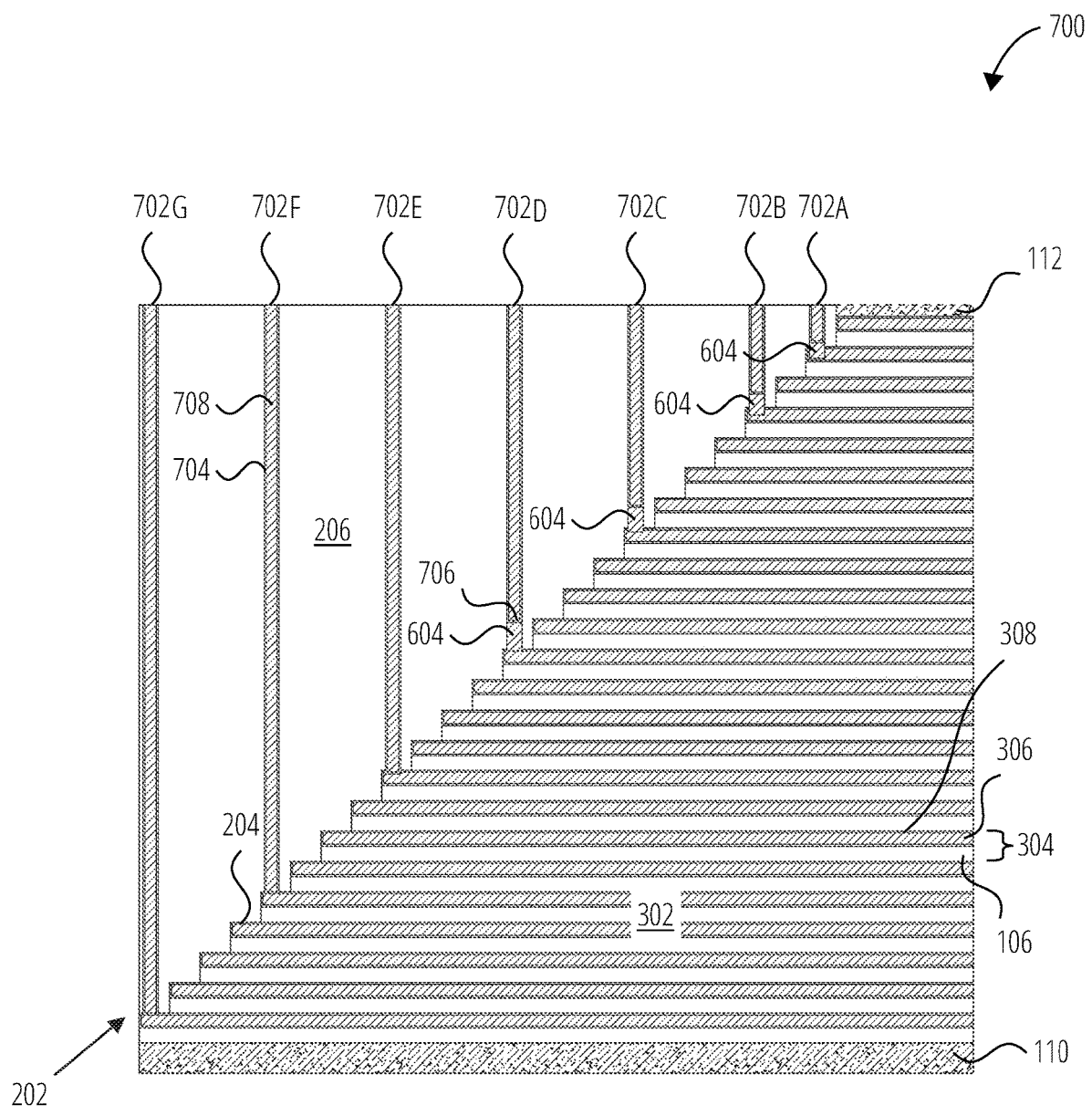

With reference to FIG. 7, contacts 702A-G are then formed in both the partially-filled contact openings 504A-D, which include the conductive extensions 604, and in the extended contact openings 602E-G, which may be free of any conductive extensions 604. Forming the contacts 702A-G may include forming (e.g., depositing) a liner 704 (e.g., including a material that is the same or different than the liner 308 on the conductive structures 306) in the partially-filled contact openings 504A-D and in the extended contact openings 602E-G. Then, a conductive material 708 (e.g., the same or different than the conductive materials described above for the conductive structures 306) may be formed (e.g., deposited) to fill the remaining space of the contacts 702A-G.

The contacts 702A-D formed in the partially-filled contact openings 504A-G may be formed directly on the conductive extensions 604. Accordingly, contacts 702A-D may not extend all the way to an upper surface of the conductive structure 306 having the targeted step 204. Moreover, the conductive extensions 604 may be spaced from the conductive material 708 of the contacts 702A-D by the liner 706. In contrast, the contacts 702E-G formed in the extended contact openings 602E-G, which did not receive conductive growths 502, may extend fully to, and may terminate on, an upper surface of a corresponding conductive structure 306 having a targeted step 204.

The conductive extensions 604, themselves, may not include a liner, such that at least the portion of the vertical sidewalls of the conductive extensions 604 that extend vertically from the respective conductive structures 306 are sidewall portions that are free of liner, such that the conductive material of the conductive extensions 604 (e.g., tungsten) is in direct contact with the fill material 206. In contrast, the contacts 702E-G not formed on conductive growths 502 may be fully lined along the height of the contacts 702E-G, all the way to the respective conductive structures 306.

By embodiments such as that illustrated in FIG. 1 to FIG. 7, a microelectronic device structure 700 is fabricated in contacts are formed in multiple contact openings of significantly different aspect ratios, so that the contacts can "land on" steps at different elevations in a staircase structure, all while avoiding so-called "punch through" openings in conductive structures at upper elevations of the staircase—e.g., the elevations most often exposed to material-removing chemicals (e.g., etchants)—without requiring multiple etch-and-mask processing stages. That is, by embodiments of the disclosure, all contact openings to be formed may be initially formed (e.g., by etching) in a single material-removal act, without having to protective mask areas where additional contact openings (e.g., for the deepest contacts) are to be formed. Moreover, the selective growth of the conductive material for the extensions enables the growth of the extensions without requiring a protective mask over partially-formed contact openings (e.g., openings terminating in fill material) in which no extensions are wanted. The fabrication process may, therefore, be simpler, faster, and more cost effective than processes that require multiple etch-and-mask stages.

Accordingly, disclosed is a method for forming a microelectronic device. A staircase structure is formed in a stack structure. The stack structure comprises insulative material vertically alternating with conductive material. The stack structure is arranged in tiers. The staircase structure comprises steps at lateral ends of the conductive material of the tiers of the stack structure. A fill material is formed adjacent the staircase structure. Contact openings are formed in the fill material. The contact openings have different aspect ratios. Some of the contact openings terminate in the fill material. Others of the contact openings expose portions of the conductive material of upper tiers of the stack structure. Additional conductive material is selectively formed on the portions of the conductive material in the others of the contact openings. Some of the contact openings are extended to form extended contact openings that expose portions of the conductive material at lower tiers of the stack structure. Contacts are formed in the others of the contact openings and in the extended contact openings. Some of the contacts extend to the additional conductive material. Others of the contacts extend to the portions of the conductive material at the lower tiers of the stack structure.

While the process described above with respect to FIG. 1 to FIG. 7 includes only two material-removal acts (e.g., a first material-removal act as illustrated in FIG. 4 and a second material-removal act as illustrated in FIG. 6), in other embodiments, more than two material-removal acts may be performed with at least one conductive material growth act interspersed amongst the material-removal acts. Each of the material-removal acts may form contact openings of differing depths and/or aspect ratios.

Figure 8:
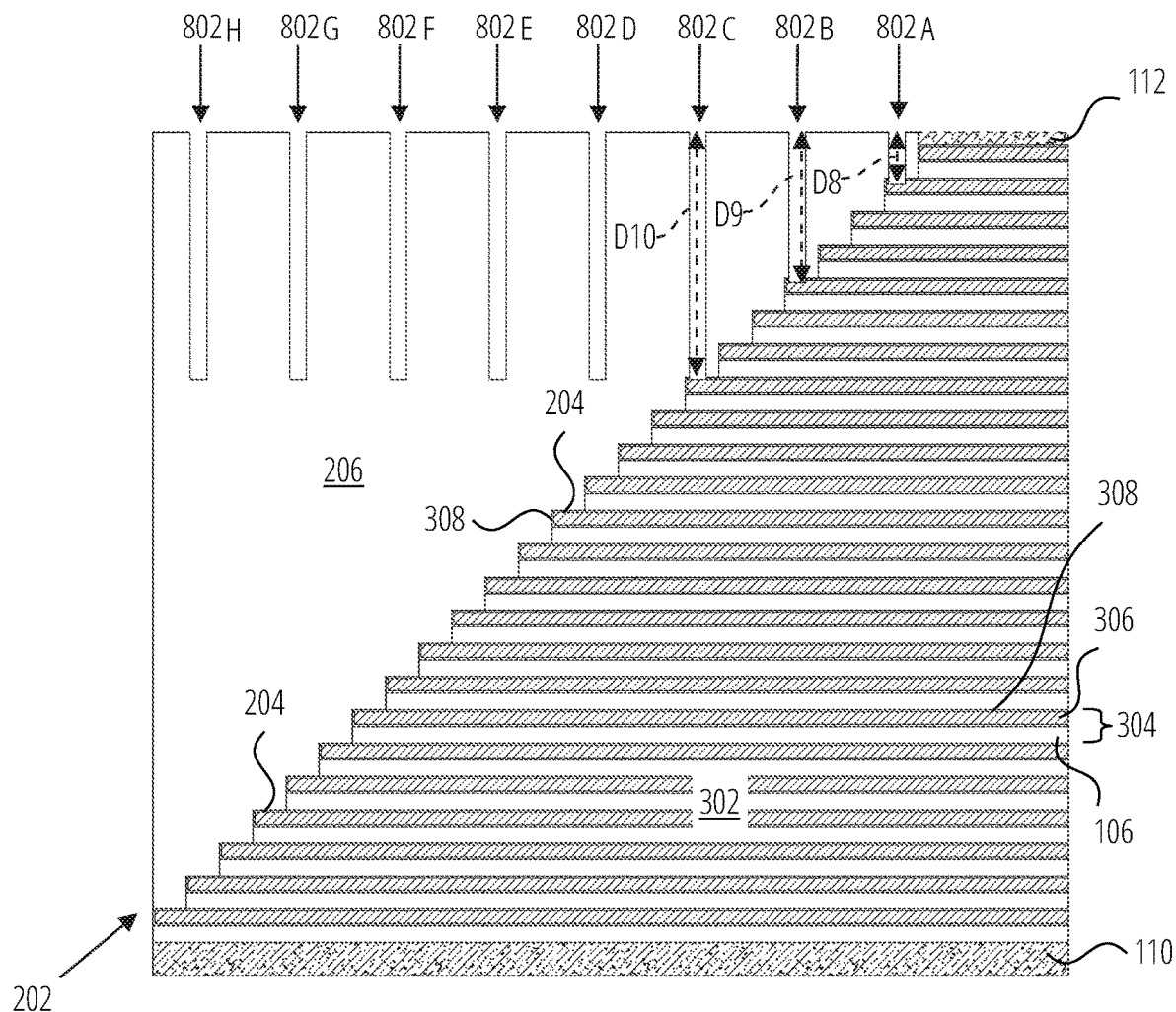
FIG. 8 to FIG. 13 are, in conjunction with FIG. 1 to FIG. 3, cross-sectional, elevational, schematic illustrations during various stages of processing to fabricate the microelectronic device structure illustrated in FIG. 13, according to embodiments of the disclosure, wherein the stage of FIG. 8 follows that of FIG. 3.

For example, as illustrated in FIG. 8, contact openings 802A-H may be formed (e.g., etched, such as in a single material-removal act) up to a depth D10 of about 33% of the tiers 304 of the staircase structure 202 (and of the stack structure 302), such as about eight tiers 304 of a twenty-four tier 304 stack structure 302. Some of the contact openings, namely contact openings 802A-C, expose a portion of a corresponding conductive structure 306. Others of the contact openings, namely contact openings 802D-H, terminate within the fill material 206.

Figure 9:
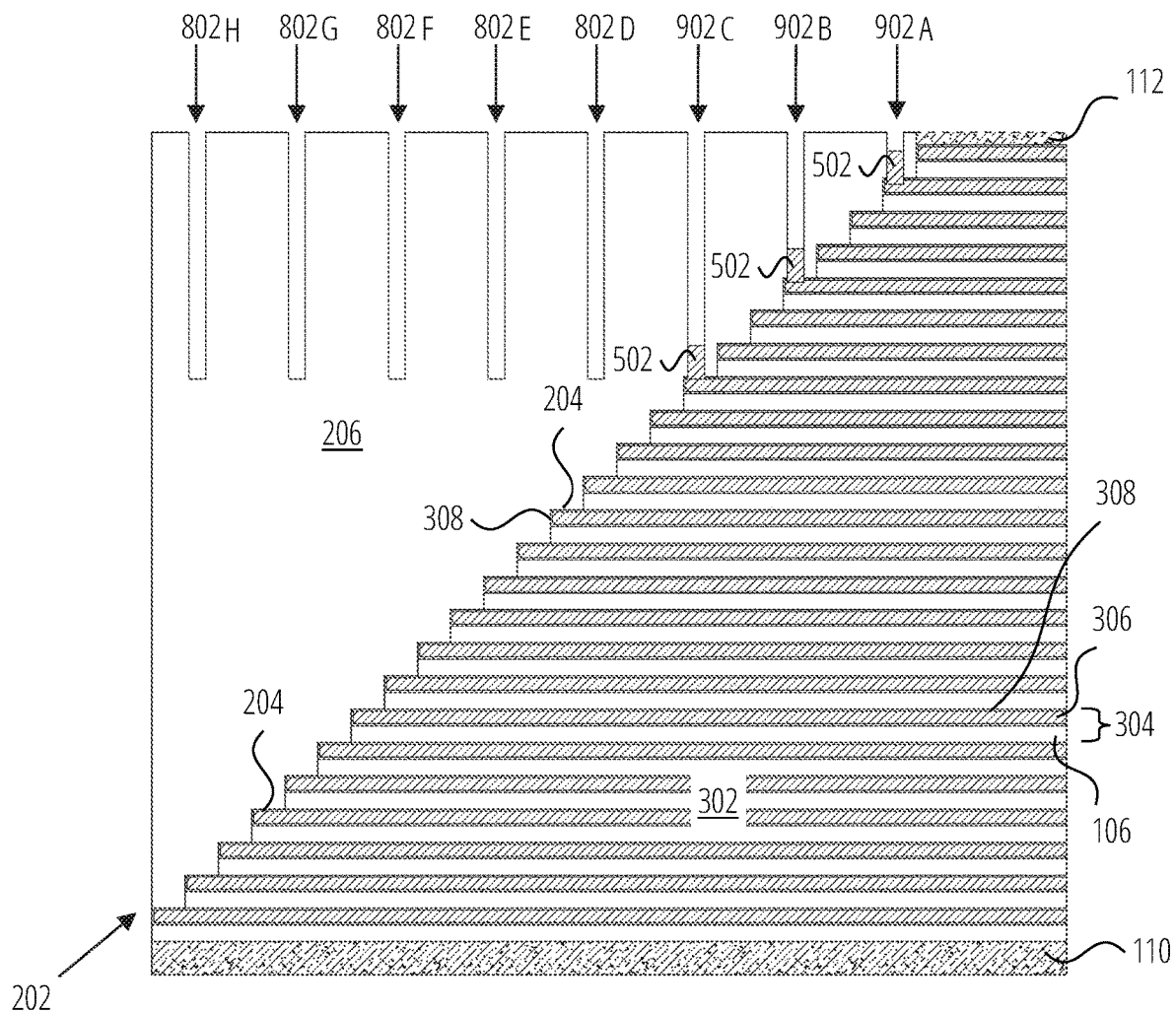
Figure 9:
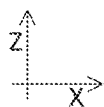

With reference to FIG. 9, conductive growths 502 are selectively formed (e.g., grown, deposited) in the contact openings 802A-H such that the conductive growths 502 form on and in direct contact with the exposed portions of the conductive structures 306 in contact openings 802A-C, forming partially-filled contact openings 902A-C. The conductive growths 502 do not form in the contact openings 802E-H, which are wholly defined by the fill material 206.

Figure 10:
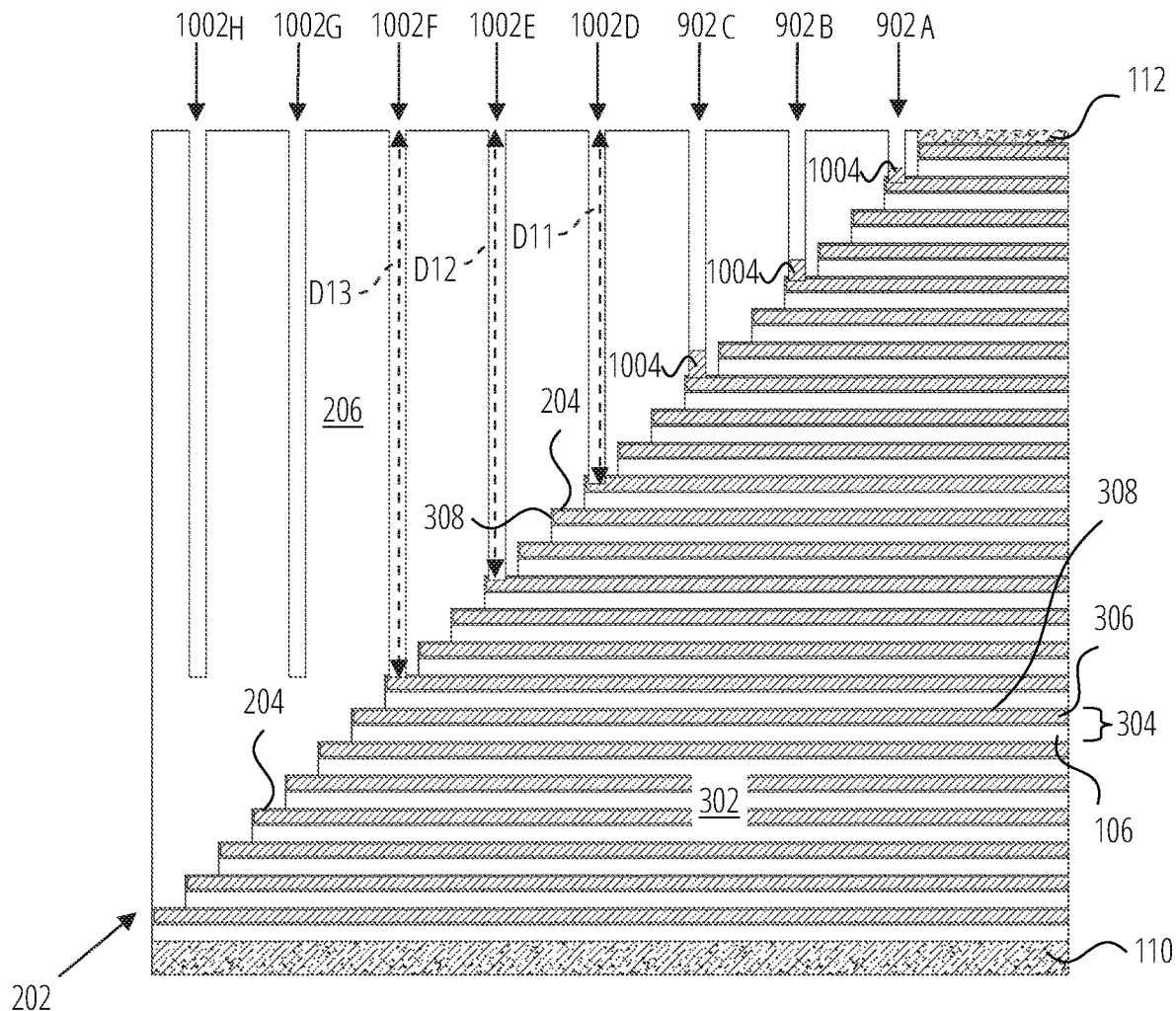

Another material-removal act extends at least all of the contact openings that previously terminated in fill material 206, e.g., contact openings 802D-H, to form—as illustrated in FIG. 10, extended contact openings 1002. This other material-removal act may extend to a maximum depth D13 of about 67% of the tiers 304 of the staircase structure 202 (and of the stack structure 302), such as up to about sixteen tiers 304 of a twenty-four tier 304 stack structure 302. Some of the extended contact openings, namely extended contact openings 1002D-F expose a portion of a corresponding one of the conductive structures 306. Others of the extended contact openings, namely extended contact openings 1002G-H, again terminate within the fill material 206.

The other material-removal act may remove material from some or all of the conductive growths 502 (FIG. 9), but the thickness of the conductive growths 502 may have been tailored to ensure that at least conductive remnant portions 1004 (FIG. 10) remain after the other material-removal act.

Figure 11:
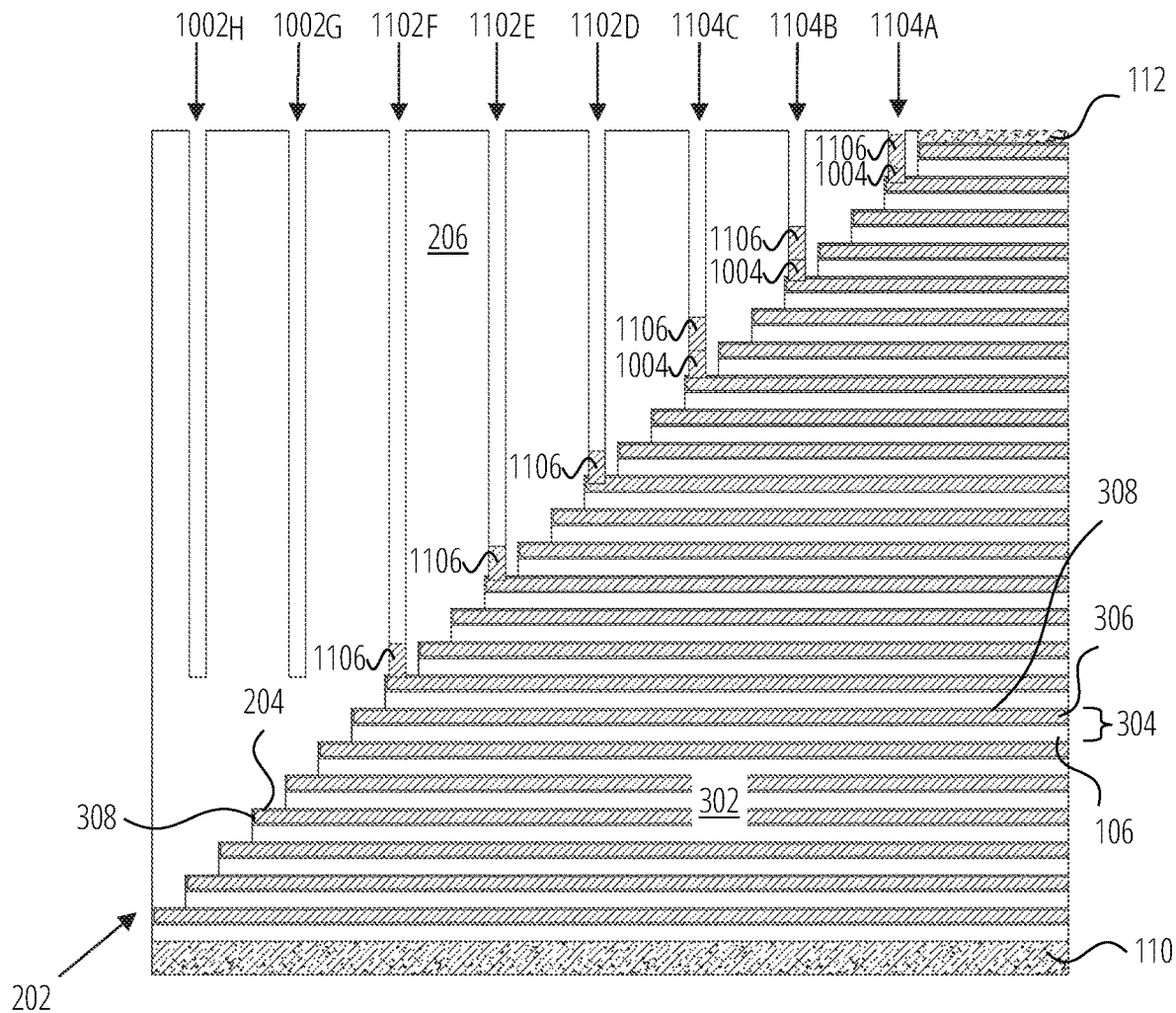

Additional conductive material (e.g., including the same or different conductive material than any of the conductive materials described above) may then be selectively formed (e.g., grown, deposited) with all of the contact openings thus-far formed (e.g., partially-filled contact openings 902A-C and extended contact openings 1002D-H) remaining uncovered (e.g., by a hardmask material). Therefore, as illustrated in FIG. 11, other conductive growths 1106 are formed on (e.g., directly on) the conductive remnant portions 1004 and on the exposed portions of the conductive structures 306. The extended contact openings 1002G-H, which terminated in the fill material 206, remain free of conductive material. Partially-filled contact openings 1102D-F include, at the base of each, one of the other conductive growths 1106 on (e.g., directly on) the portion of the conductive structures 306 that were exposed in extended contact openings 1002D-F (FIG. 10). Partially-filled contact openings 1104A-C include, at the base of each, multiple portions of grown conductive material, namely, the conductive remnant portion 1004 and the other conductive growth 1106.

Figure 12:
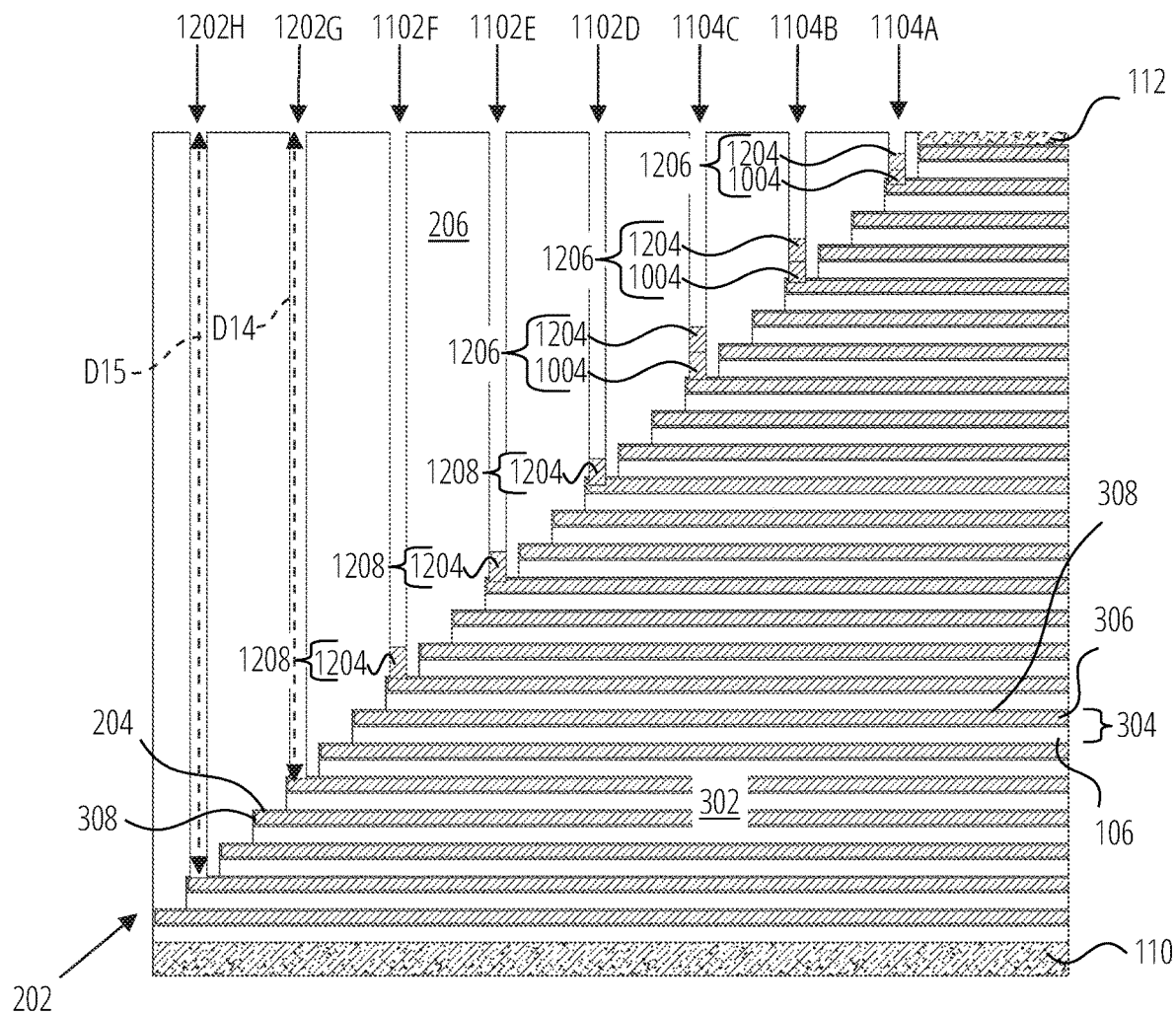

A final material-removal act completes formation of the contact openings, as illustrated in FIG. 12, with contact openings 1202G-H exposing a portion of corresponding conductive structures 306 at depths D14 and D15, respectively. During the final material-removal act, each of the openings may remain uncovered (e.g., free of a hardmask material over the openings). Therefore, this final material-removal act may, in some embodiments, remove material from some or all of the other conductive growths 1106 (FIG. 11) that exposed during the final material-removal act. Even so, the thickness of the other conductive growths 1106 may have been tailored to ensure that at least a portion thereof would remain after the final material-removal act, forming other conductive remnant portions 1204. In the partially-filled contact openings 1104A-C, conductive extensions 1206 include the conductive remnant portion 1004 and the other conductive remnant portion 1204. In the partially-filled contact openings 1102D-F, other conductive extensions 1208 include only the other conductive remnant portion 1204.

Figure 13:
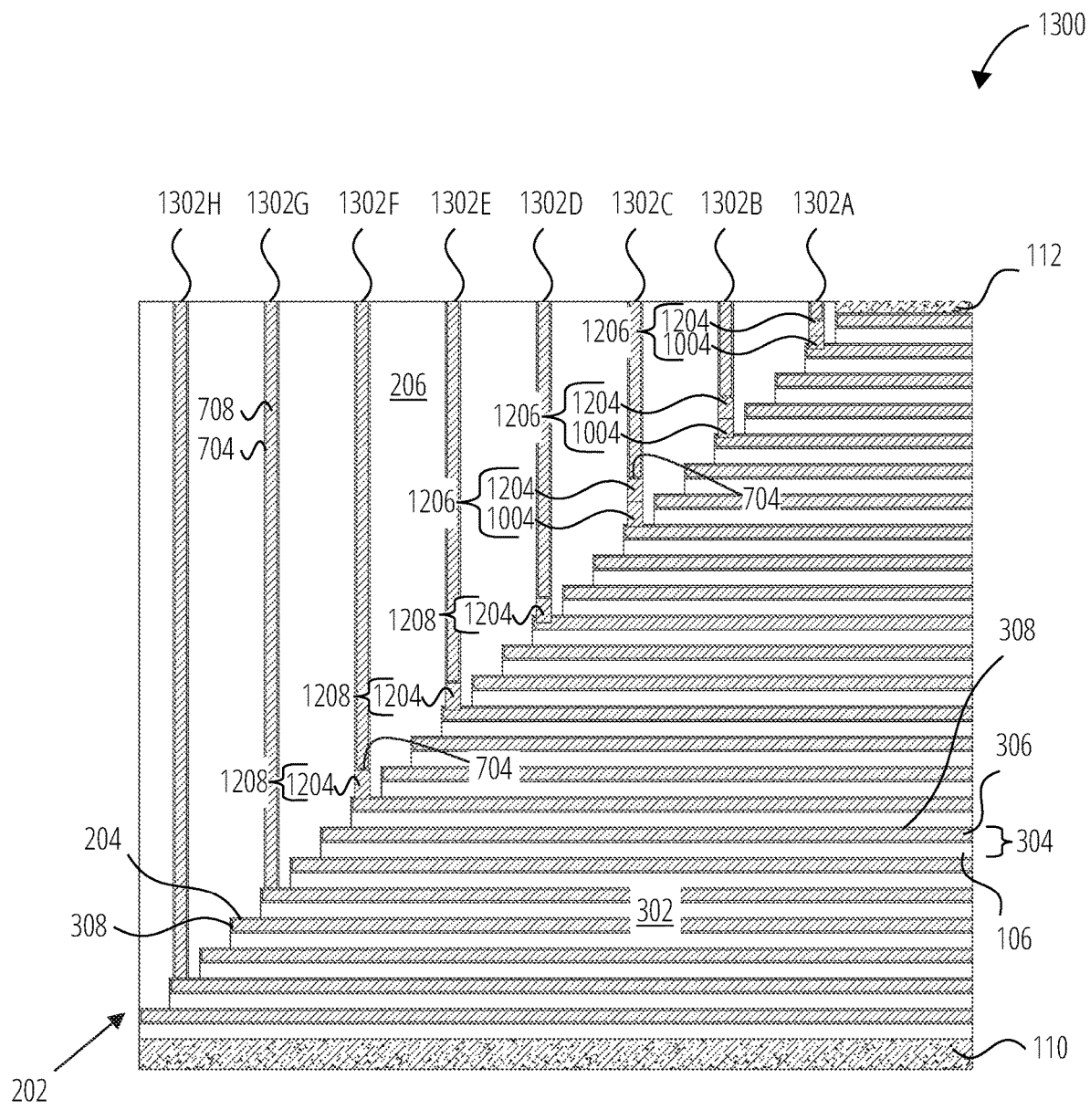
Figure 13:
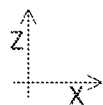

With reference to FIG. 13, contacts 1302 may then be formed in all of the contact openings (e.g., the partially-filled contact openings 1104A-C, the partially-filled contact openings 1102D-F, the fully-extended contact opening 1202G-H of FIG. 12), e.g., in the same manner as described above with respect to forming the contacts 702A-G of FIG. 7. A resulting microelectronic device structure 1300 may, therefore, include the liner 704 between the conductive material 708 of the contacts 1302A-H and the conductive material of the conductive extensions 1206 or the other conductive extensions 1208, respectively.

In some embodiments, more than one material-removal act may be performed to form or extend contact openings without an intervening material-formation (e.g., growth, deposition) act. Likewise, in some embodiments, more than one material-formation (e.g., growth, deposition) act may be performed to form conductive growths or extensions without an intervening material-removal act (e.g., without extending the depth of contact openings between material formations). Even so, in some embodiments, all formed or partly-formed contact openings may remain uncovered (e.g., without a protective hardmask) during the additional material-removal and material-formation acts.

Figure 14:
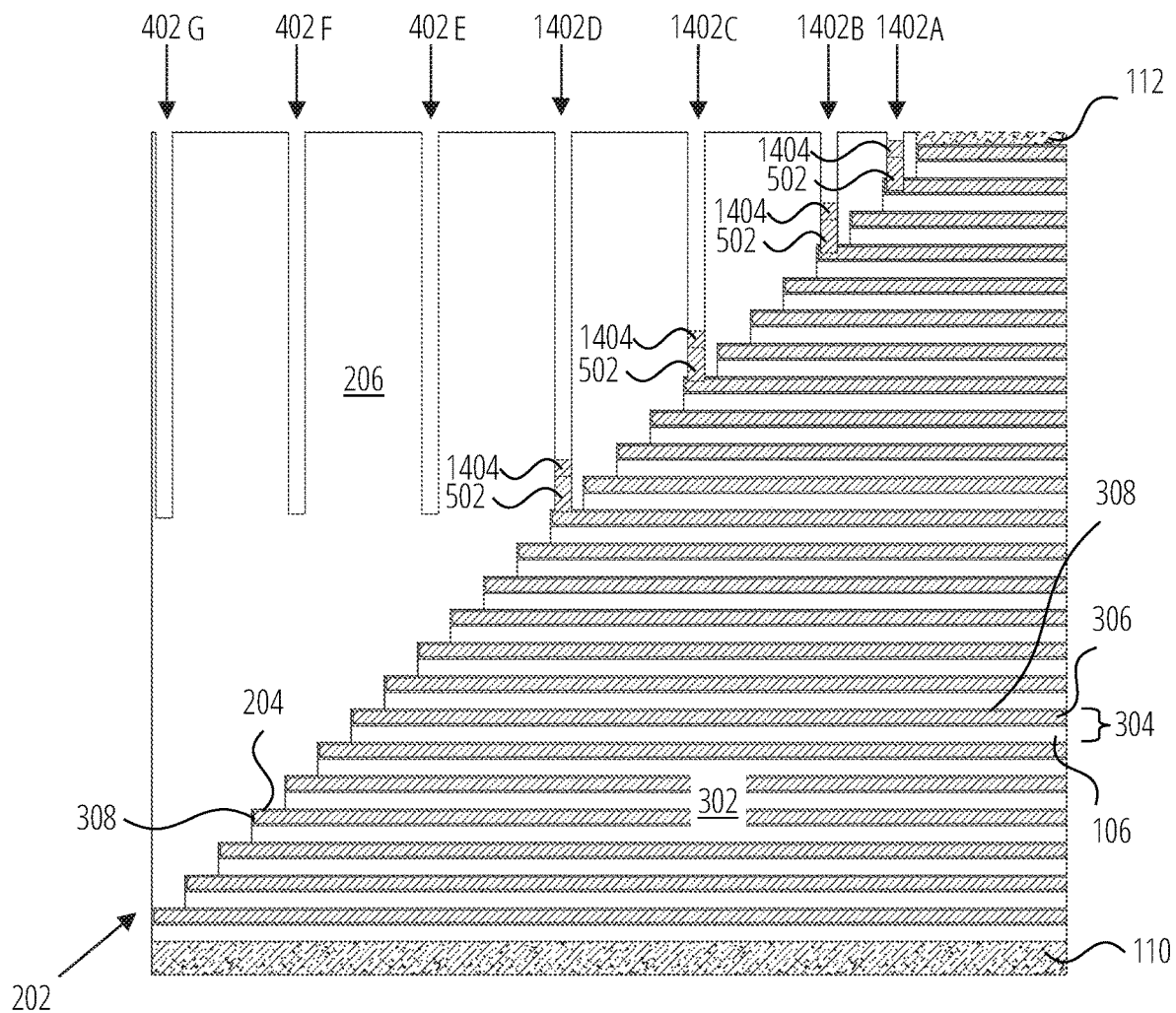
FIG. 14 to FIG. 16 are, in conjunction with FIG. 1 to FIG. 5, cross-sectional, elevational, schematic illustrations during various stages of processing to fabricate the microelectronic device structure illustrated in FIG. 16, according to embodiments of the disclosure, wherein the stage of FIG. 14 follows that of FIG. 5.

For example, the formation of the conductive growth 502 of FIG. 5 may be followed by selective growth of an additional amount of conductive material, as illustrated in FIG. 14. Partially-filled contact openings 1402A-D therefor include other growths 1404 on (e.g., directly on) the conductive growths 502. Because of the selective formation of the conductive material, the other growths 1404 do not form in the contact openings 402E-G that terminate in the fill material 206.

Figure 15:
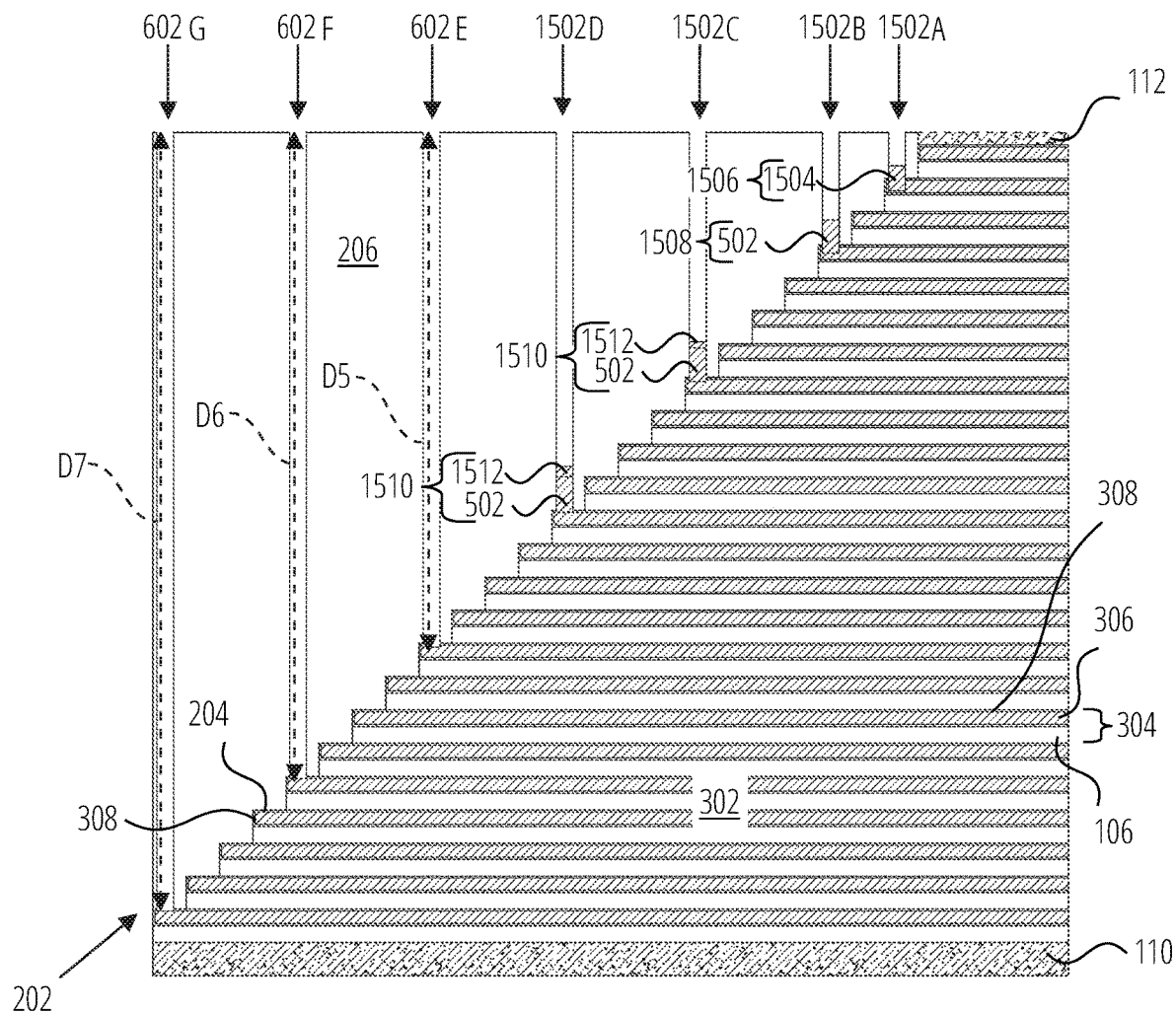
Figure 15:
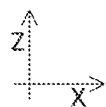

The contact openings 402E-G may then be extended to form the extended contact openings 602E-G having depths D5, D6, and D7, respectively, as illustrated in FIG. 15, while the partially-filled contact openings 1402A-D (FIG. 14) remain uncovered. During the material-removal process to form the extended contact openings 602E-G, material may be removed from the exposed conductive material in the partially-filled contact openings 1402A-D, e.g., from the other growths 1404 and—if the other growth 1404 is wholly removed from any of the partially-filled contact openings 1402A-D—also from the conductive growths 502. By tailoring the thickness of the conductive materials formed during the selective growth, material-formation acts, at least some of conductive material remains to form partially-filled contact openings 1502A-D, with partially-filled contact openings 1502A having a final conductive remnant portion 1504 (from the conductive growth 502) providing a conductive extension 1506; partially-filled contact opening 1502B having the whole conductive growth 502 providing a conductive extension 1508, and each of partially-filled contact opening 1502C-D having a conductive remnant portion 1512 (from other growths 1404) and the conductive growth 502 together providing a conductive extension 1510.

Figure 16:
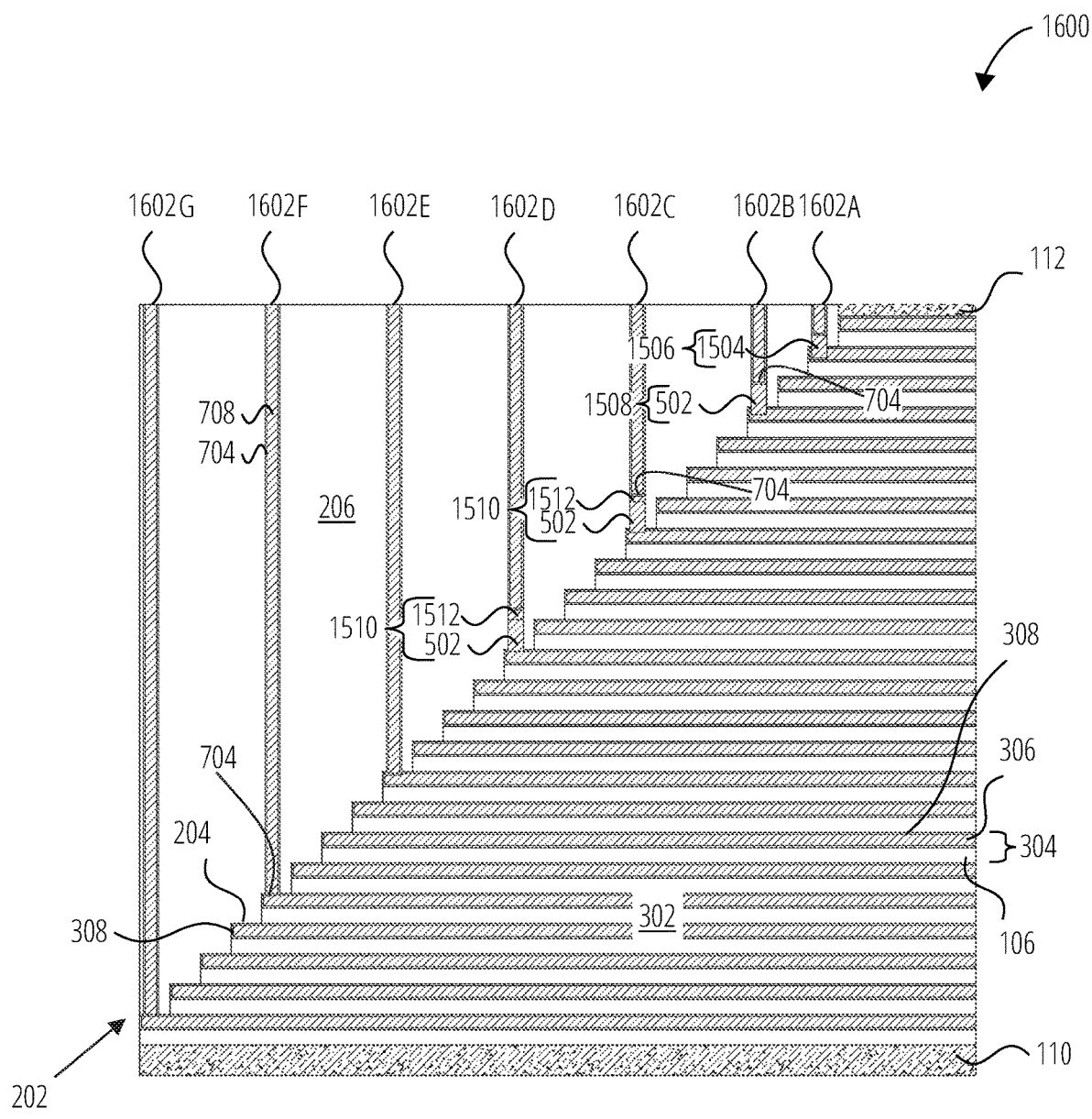

With reference to FIG. 16, a microelectronic device structure 1600 is then formed by forming contacts 1602A-G in the contact openings, namely in the partially-filled contact openings 1502A-D and in the extended contact openings 602E-G.

Accordingly, disclosed is a microelectronic device comprising a stack structure, contacts, and conductive extensions in upper elevations of the staircase structure. The stack structure comprises insulative structures vertically alternating with conductive structures and arranged in tiers forming a staircase structure having steps at lateral ends of the conductive structures of the tiers. The contacts extend toward steps at different elevations of the staircase structure. The contacts comprise a nitride liner. In the upper elevations of the staircase structure, the conductive extensions are directly between the nitride liner (of the contacts) and the conductive structures (of the tiers). In lower elevations of the staircase structure, the contacts extend fully to the conductive structures of the tiers.

Figure 17:
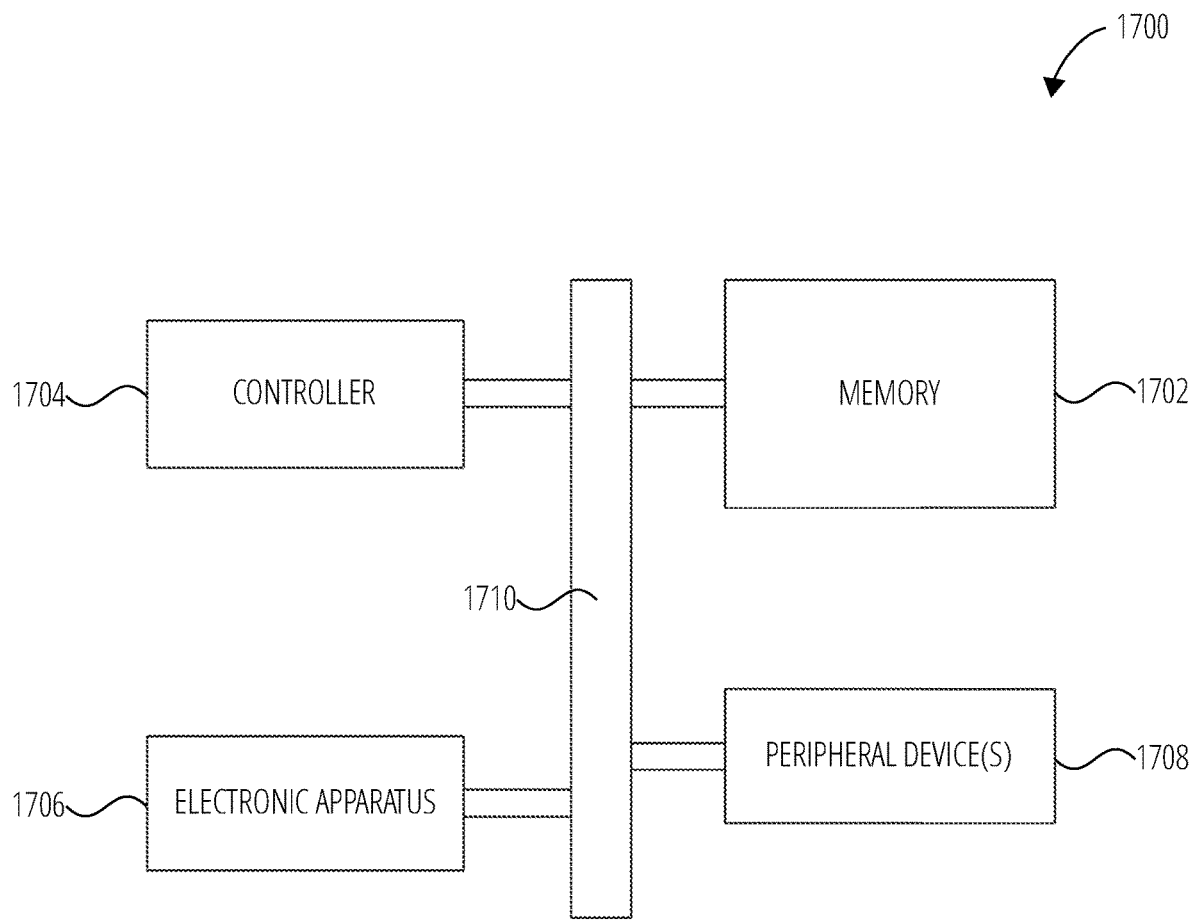
FIG. 17 shows a block diagram of an electronic system including a microelectronic device structure of embodiments of the disclosure.

FIG. 17 shows a block diagram of a system 1700, according to embodiments of the disclosure, which system 1700 includes memory 1702 including an array of vertical strings of memory cells. The architecture and structure of the memory 1702 may include one or more of the microelectronic device structure 700 of FIG. 7, the microelectronic device structure 1300 of FIG. 13, and/or the microelectronic device structure 1600 of FIG. 16, according to embodiments of the disclosure, and may be fabricated according to one or more of the methods described above.

The system 1700 may include a controller 1704 operatively coupled to the memory 1702. The system 1700 may also include another electronic apparatus 1706 and one or more peripheral device(s) 1708. The other electronic apparatus 1706 may, in some embodiments, include one or more of the microelectronic device structure 700 of FIG. 7, the microelectronic device structure 1300 of FIG. 13, and/or the microelectronic device structure 1600 of FIG. 16, according to embodiments of the disclosure and fabricated according to one or more of the methods described above. One or more of the controller 1704, the memory 1702, the other electronic apparatus 1706, and the peripheral device(s) 1708 may be in the form of one or more integrated circuits (ICs).

A bus 1710 provides electrical conductivity and operable communication between and/or among various components of the system 1700. The bus 1710 may include an address bus, a data bus, and a control bus, each independently configured. Alternatively, the bus 1710 may use conductive lines for providing one or more of address, data, or control, the use of which may be regulated by the controller 1704. The controller 1704 may be in the form of one or more processors.

The other electronic apparatus 1706 may include additional memory (e.g., with one or more of the microelectronic device structure 700 of FIG. 7, the microelectronic device structure 1300 of FIG. 13, and/or the microelectronic device structure 1600 of FIG. 16, according to embodiments of the disclosure and fabricated according to one or more of the methods described above). Other memory structures of the memory 1702 and/or the other electronic apparatus 1706 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 1708 may include displays, imaging devices, printing devices, wireless devices, additional storage memory, and/or control devices that may operate in conjunction with the controller 1704.

The system 1700 may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is a system comprising a three-dimensional array of memory devices, at least one processor in operable communication with the three-dimensional array of memory devices, and at least one peripheral device in operable communication with the at least one processor. The three-dimensional array of memory devices comprises a stack structure comprising insulative materials interleaved with conductive materials. A staircase structure, within the stack structure, has steps comprising lateral ends of the conductive materials of the stack structure. Contacts extend toward steps at upper elevations of the at least one staircase structure. The contacts have different height-to-width ratios from one another. Additional contacts extend to steps at lower elevations of the staircase structure. Conductive extensions are between the steps (at the upper elevations of the staircase structure) and a liner material (of the contacts).

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A method for forming a microelectronic device, the method comprising:
   forming a staircase structure in a stack structure, the stack structure comprising insulative structures and conductive structures vertically alternating with the insulative structures, the insulative structure and the conductive structures arranged in tiers, each of the tiers comprising one of the insulative structures and one of the conductive structures, the staircase structure having steps comprising lateral ends of the tiers;
   forming a fill material adjacent the staircase structure;
   forming contact openings with different aspect ratios in the fill material, some of the contact openings terminating in the fill material, others of the contact openings exposing portions of the conductive structures of tiers in upper elevations of the staircase structure;
   selectively forming additional conductive material on the portions of the conductive structures exposed in the others of the contact openings to form conductive extensions in at least the upper elevations of the staircase structure;
   extending the some of the contact openings to form extended contact openings that expose portions of the conductive structures of tiers in lower elevations of the staircase structure; and
   forming contacts in the others of the contact openings and in the extended contact openings, the contacts extending toward steps at different elevations of the staircase structure, the contacts comprising a nitride liner;
   the method forming a microelectronic device wherein:
      in the upper elevations of the staircase structure, the conductive extensions are interposed directly between the nitride liner of the contacts and the conductive structures of the tiers, and
      in the lower elevations of the staircase structure, the contacts extend fully to the conductive structures of the tiers.

2. The method of claim 1, wherein, while extending the some of the contact openings to form the extended contact openings, the additional conductive material remains exposed in the others of the contact openings.

3. The method of claim 1, wherein forming the contact openings with the different aspect ratios in the fill material comprises forming the some of the contact openings terminating in the fill material to have substantially a same depth as one another.

4. The method of claim 1, further comprising, before extending the some of the contact openings to form the extended contact openings, selectively forming more conductive material on the additional conductive material to form the conductive extensions, in the upper elevations of the staircase structure, to comprise the more conductive material and the additional conductive material.

5. The method of claim 1, wherein forming the contact openings with the different aspect ratios in the fill material comprises at least partially forming, by one material-removal act, contact openings for all of the contacts to be formed in electrical connection with steps of the staircase structure.

6. The method of claim 1, wherein forming the contact openings with the different aspect ratios in the fill material comprises forming the contact openings to a depth of up to about 50% of a height of the staircase structure.

7. The method of claim 1, further comprising, after extending the some of the contact openings, selectively forming more conductive material on the portions of the conductive material of some of the lower tiers of the stack structure above the lower elevations of the staircase structure in which the contacts extend fully to the conductive structures of the tiers.

8. The method of claim 7, wherein forming the more conductive material further comprises forming the more conductive material also on the additional conductive material to form some of the conductive extensions to comprise the more conductive material and the additional conductive material.

9. The method of claim 1, wherein forming the contacts in the others of the contact openings and in the extended contact openings comprises forming the nitride liner in the contact openings and in the extended contact openings.

10. The method of claim 1, wherein forming the contacts in the others of the contact openings and in the extended contact openings comprises:
    forming the nitride liner on the portions of the conductive structures of the tiers in the lower elevations of the staircase structure; and
    forming the nitride liner on the additional conductive material of the conductive extensions in the others of the contact openings.

11. A microelectronic device, comprising:
    a stack structure comprising insulative structures and conductive structures vertically alternating with the insulative structures, the insulative structures and the conductive structures arranged in tiers, each of the tiers comprising one of the insulative structures and one of the conductive structures;
    a staircase structure having steps comprising lateral ends of the tiers;
    contacts extending toward steps at different elevations of the staircase structure, the contacts comprising a nitride liner;
    in upper elevations of the staircase structure, conductive extensions interposed directly between the nitride liner of the contacts and the conductive structures of the tiers; and
    in lower elevations of the staircase structure, the contacts extending fully to the conductive structures of the tiers.

12. The microelectronic device of claim 11, wherein:
the conductive structures comprise tungsten; and
the conductive extensions comprise tungsten.

13. The microelectronic device of claim 11, wherein the conductive extensions are free of a liner material on vertical sidewalls of the conductive extensions.

14. The microelectronic device of claim 11, wherein at least one of the conductive extensions extends downward into a conductive structure, of the conductive structures.

15. The microelectronic device of claim 11, wherein the upper elevations of the staircase structure comprise an upper half of the tiers.

16. The microelectronic device of claim 11, wherein the lower elevations of the staircase structure comprise a lower third of the tiers.

17. The microelectronic device of claim 11, wherein at least one of the conductive extensions has a greater thickness than at least one of the conductive structures from which the at least one of the conductive extensions extends.

18. A system, comprising:
a three-dimensional array of microelectronic devices, at least one of the microelectronic devices comprising:
a stack structure comprising insulative structures and conductive structures vertically alternating with the insulative structures, the insulative structures and the conductive structures arranged in tiers, each of the tiers comprising one of the insulative structures and one of the conductive structures;
a staircase structure having steps comprising lateral ends of the tiers;
contacts extending toward steps at different elevations of the staircase structure, the contacts comprising a nitride liner;
in upper elevations of the staircase structure, conductive extensions interposed directly between the nitride of the contacts and the conductive structures of the tiers; and
in lower elevations of the staircase structure, the contacts extending fully to the conductive structures of the tiers;
at least one processor in operable communication with the three-dimensional array of microelectronic devices; and
at least one peripheral device in operable communication with the at least one processor.

* * * * *

UNITED STATES PATENT AND TRADEMARK OFFICE
CERTIFICATE OF CORRECTION

PATENT NO. : 11,158,577 B2  
APPLICATION NO. : 16/778346  
DATED : October 26, 2021  
INVENTOR(S) : Biow Hiem Ong et al.

Page 1 of 1

It is certified that error appears in the above-identified patent and that said Letters Patent is hereby corrected as shown below:

In the Claims

| | | | |
|---|---|---|---|
| Claim 1, | Column 15, | Line 32, | change "structure" to --structures-- |
| Claim 18, | Column 18, | Line 12, | change "nitride of" to --nitride liner of-- |

Signed and Sealed this
Twenty-eighth Day of December, 2021

Drew Hirshfeld
*Performing the Functions and Duties of the
Under Secretary of Commerce for Intellectual Property and
Director of the United States Patent and Trademark Office*